United States Patent
Weng et al.

(10) Patent No.: US 7,045,460 B1
(45) Date of Patent: May 16, 2006

(54) METHOD FOR FABRICATING A PACKAGING SUBSTRATE

(75) Inventors: Yi-Tang Weng, Tao-Yuan (TW); Wei-Hsin Lin, Taipei Hsien (TW); Shing-Fun Ho, Taipei (TW)

(73) Assignee: Nan Ya Printed Circuit Board Corporation, Taoyuan (TW)

( * ) Notice: Subject to any disclaimer, the term of this patent is extended or adjusted under 35 U.S.C. 154(b) by 0 days.

(21) Appl. No.: 11/162,801

(22) Filed: Sep. 23, 2005

(30) Foreign Application Priority Data

Jan. 4, 2005 (TW) ............................ 94100167 A (51) Int. Cl.
*H01L 21/44* (2006.01)

(52) U.S. Cl. .................. 438/671; 438/686; 438/688

(58) Field of Classification Search ........ 438/107–106, 438/111, 123, 125–126, 411, 611–612, 638, 438/686–688, 781; 257/687, 499, 723, 734, 257/737, 783, 781
See application file for complete search history.

(56) References Cited

U.S. PATENT DOCUMENTS

| | | | | |
|---|---|---|---|---|
| 5,536,677 | A * | 7/1996 | Hubacher | 438/613 |
| 6,424,036 | B1 * | 7/2002 | Okada | 257/734 |
| 6,576,540 | B1 | 6/2003 | Hsu et al. | |
| 6,897,090 | B1 * | 5/2005 | DiStefano et al. | 438/106 |
| 6,930,044 | B1 * | 8/2005 | Weng | 438/671 |
| 2003/0207499 | A1 * | 11/2003 | DiStefano et al. | 438/125 |
| 2005/0073035 | A1 * | 4/2005 | Moxham | 257/678 |
| 2005/0140026 | A1 * | 6/2005 | Salmon | 257/778 |
| 2005/0153483 | A1 * | 7/2005 | Groenhuis et al. | 438/124 |
| 2005/0179143 | A1 * | 8/2005 | Moxham | 257/782 |

* cited by examiner

*Primary Examiner*—Michael Lebentritt
*Assistant Examiner*—Andre' Stevenson
(74) *Attorney, Agent, or Firm*—Winston Hsu (57) ABSTRACT

A packaging substrate is fabricated using two plating steps for respectively plating the gold-plating areas defined on two opposite sides of the substrate. Before plating, the gold-plating areas are defined by a layer of solder mask. By doing this, the plated gold layer will not overlap with the solder mask, thereby preventing peeling or reliability problems.

8 Claims, 12 Drawing Sheets

METHOD FOR FABRICATING A PACKAGING SUBSTRATE

BACKGROUND OF THE INVENTION

1. Field of the Invention

The present invention relates generally to the field of circuit boards. More particularly, the present invention relates to a method for manufacturing a packaging substrate.

2. Description of the Prior Art

As the functionality and performance of network systems, high-end servers, and mobile communication devices improves, the demand for high-performance, high pin count packages is increasing. This increasing demand requires new technologies, which incorporate high pin count and also delivers performance via impedance control, low crosstalk, DC/AC resistance, and low VG impedance. Sophisticated interconnect technology has become essential for meeting these needs by improving the density and reliability of the substrates for LSI package and module boards. While high-density packages such as flip-chip and BGA devices permit very high input-output (I/O) counts, the resulting close dimensions introduce substantial yield and cost challenges.

As known in the art, dense circuit patterns with intensive fine copper lines that are electrically connected to a number of contact pads are fabricated on the surface of the packaging substrate for the transmission of electronic signals or power. On the top surface of the electrical contact pads, a Ni/Au layer, which is also referred to as "soft gold layer", is typically formed with electroplating to ensure that the bonding pads are in excellent electrical coupling with a circuit of a chip. Furthermore, other electrical contact pads of a substrate, solder ball pads for example, are covered with a Ni/Au layer electroplated on the surface, so that the conducting pads (usually made of copper composition) of the solder ball pads can be prevented from oxidation to improve the electrical interconnection performance of the solder ball pads. After the Ni/Au layer plating, surface finish processes such as solder mask coating are then carried out to finish the manufacturing of the packaging substrate.

To fabricate a packaging structure, in accordance with some prior art methods in the public domain, it is required to dispose a plurality of conducting wires for electroplating. These conducting wires are also known as "plating bus", which are used to assist the electroplating process for forming the Ni/Au structure electroplated on the contact pads. However, These conducting wires occupy a large amount of area, thus leading to sacrificing the surface area for functional circuit layout pattern. Another drawback of employing plating bus is that when operating at high frequency, noise due to the antenna effect may occur, and thus adversely affecting chip performance. Furthermore, according to the prior art, it is also problematic that the Ni/Au layer overlaps with solder mask coating since the poor adhesion between the Ni/Au layer and the solder mask coating might cause peeling and thus affect reliability.

U.S. Pat. No. 6,576,540 filed Mar. 22, 2002, entitled "Method for fabricating substrate within a Ni/Au structure electroplated on electrical contact pads", teaches a method comprising the steps of: providing a substrate with a circuit layout pattern and forming a conducting film on the surface of the substrate; depositing a first photoresist layer within an opening on said electrical conducting film surface to expose a portion of said circuit layout pattern to be electrical contact pads; removing the exposed conducting film uncovered by the first photoresist layer; depositing a second photoresist layer, covering the conducting film exposed in the openings of the first photoresist layer; electroplating Ni/Au covering the surface of the electrical contact pads; removing the first and second photoresists, and the conducting film covered by the photoresists; depositing solder mask on the substrate within an opening to expose said electrical contact pads.

The prior art described in U.S. Pat. No. 6,576,540 has several drawbacks. First, it requires an additional metallization process after that the circuit line pattern is formed on the substrate, and is thus costly. Second, the circuit line pattern formed on the substrate may be damaged due to scratching or collision during its fabrication process, thus affecting the function of the circuitry. Another drawback of the above-described prior art is that peeling problem between the metal layer formed in a later stage of the fabrication process causes reduced yields.

In light of the above, there is a strong need in the packaging industry to provide a cost-effective method for manufacturing a packaging substrate to solve the above-described problems.

SUMMARY OF THE INVENTION

It is the primary object of the present invention to provide an improved method for fabricating a packaging substrate to cope with the above-described problems.

According to the claimed invention, a method for manufacturing a packaging substrate is provided. This invention comprises the following steps:

(1) providing a substrate having at least one through hole formed thereon;

(2) coating a first conductive layer on a top surface and a bottom surface of the substrate, and on sidewall of the through hole;

(3) performing a lithographic and etching process to pattern the first conductive layer into a first wire pattern on the top surface of the substrate and a second wire pattern on the bottom surface of the substrate, wherein the first wire pattern and the second wire pattern are electrically connected to each other via the through hole;

(4) coating a solder mask on the top surface and the bottom surface of the substrate, and the solder mask filling the through hole;

(5) forming, in the solder mask, a first opening exposing a portion of the first wire pattern and a second opening exposing a portion of the second wire pattern;

(6) blanketing the top surface of the substrate with a second conductive layer, wherein the second conductive layer covers the solder mask and the first opening, and is electrically connected with the first wire pattern;

(7) coating a first insulating layer on the second conductive layer; and (8) electroplating a third conductive layer on the second wire pattern within the second opening on the bottom surface of the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

One preferred embodiment of the method of manufacturing packaging substrate in accordance with the present invention will be explained as follows referring to FIG. 1 to FIG. 12. FIG. 1 to FIG. 12 are schematic cross-sectional diagrams illustrating the present invention method of making a packaging substrate.

Figure 1:
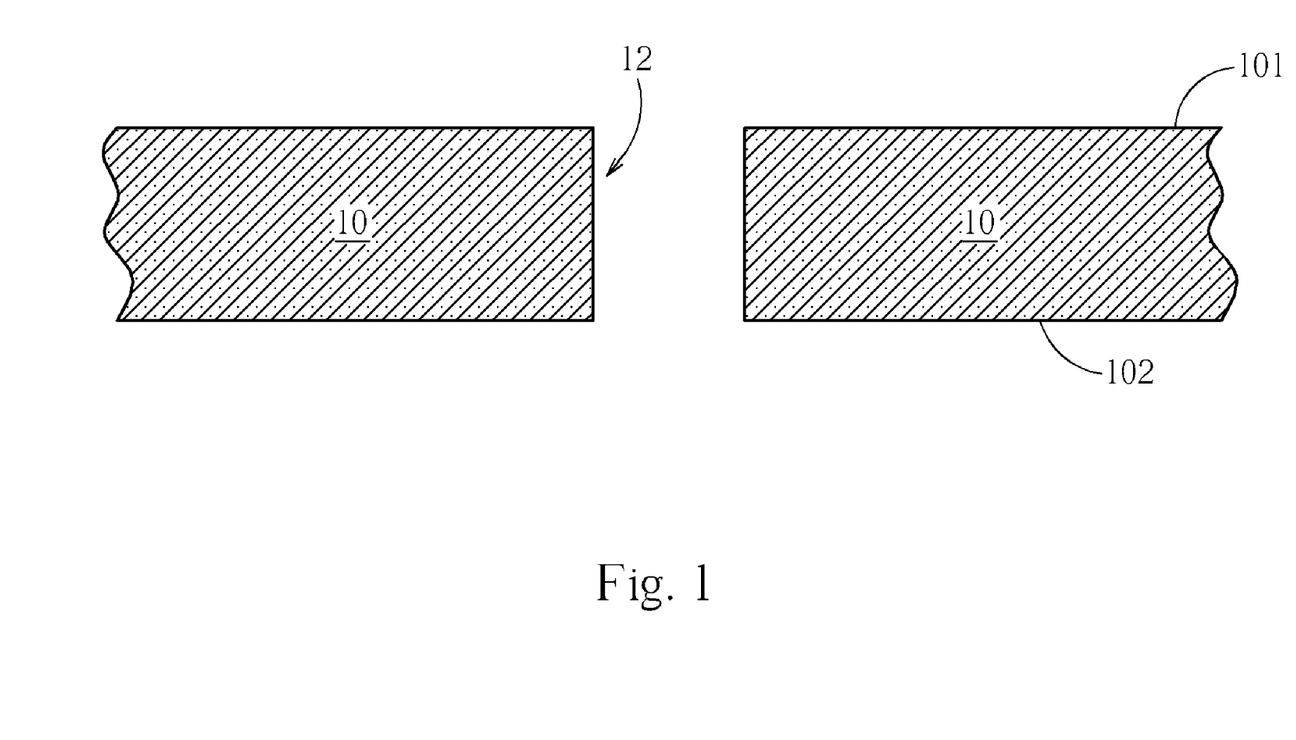
FIG. 1 to FIG. 12 are schematic cross-sectional diagrams illustrating the present invention method of making a packaging substrate.

As shown in FIG. 1, a substrate 10 is provided. The substrate 10 has a top surface 101 and a bottom surface 102. First, the substrate 10 is drilled to form a plurality of through holes 12.

Figure 2:
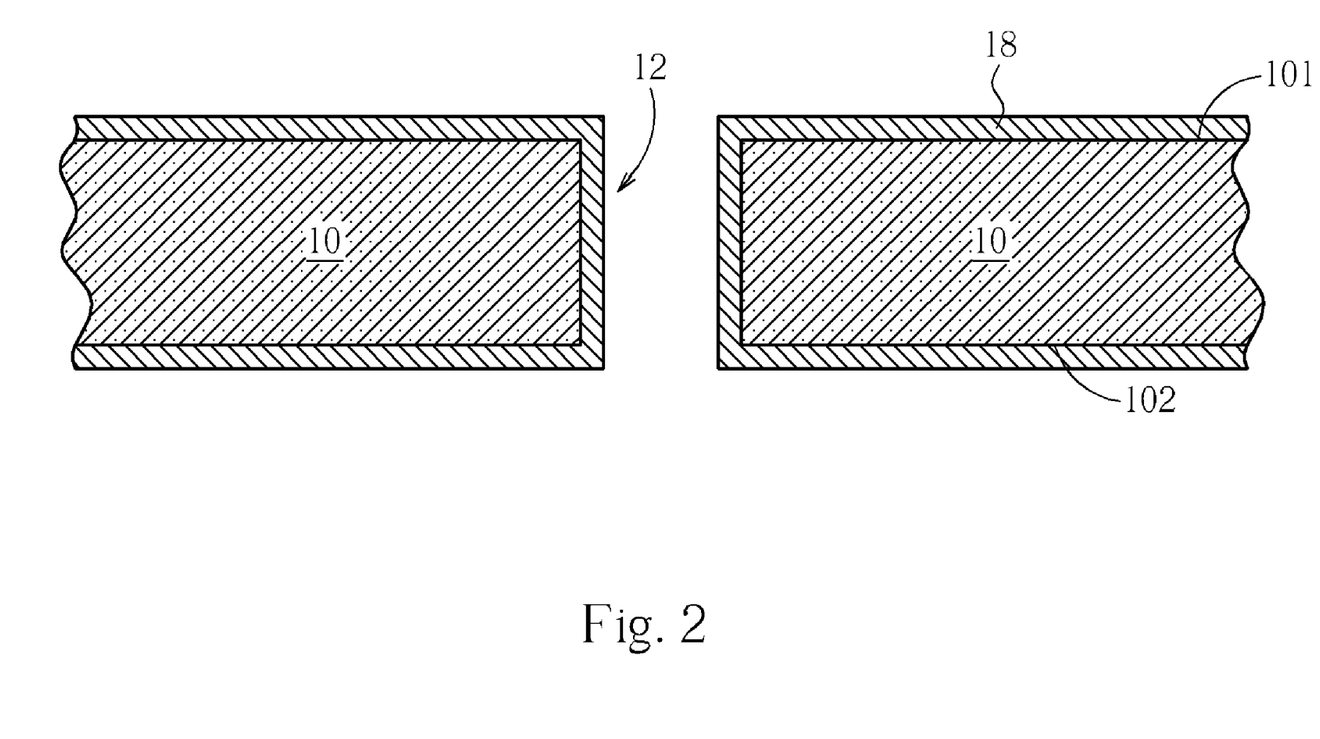

As shown in FIG. 2, a metallization process is carried out to form a copper layer 18 on the surfaces of the substrate 10 and the through holes 12. The copper layer 18 may be chemically deposited copper and has a thickness that is less than 10 microns.

Figure 3:
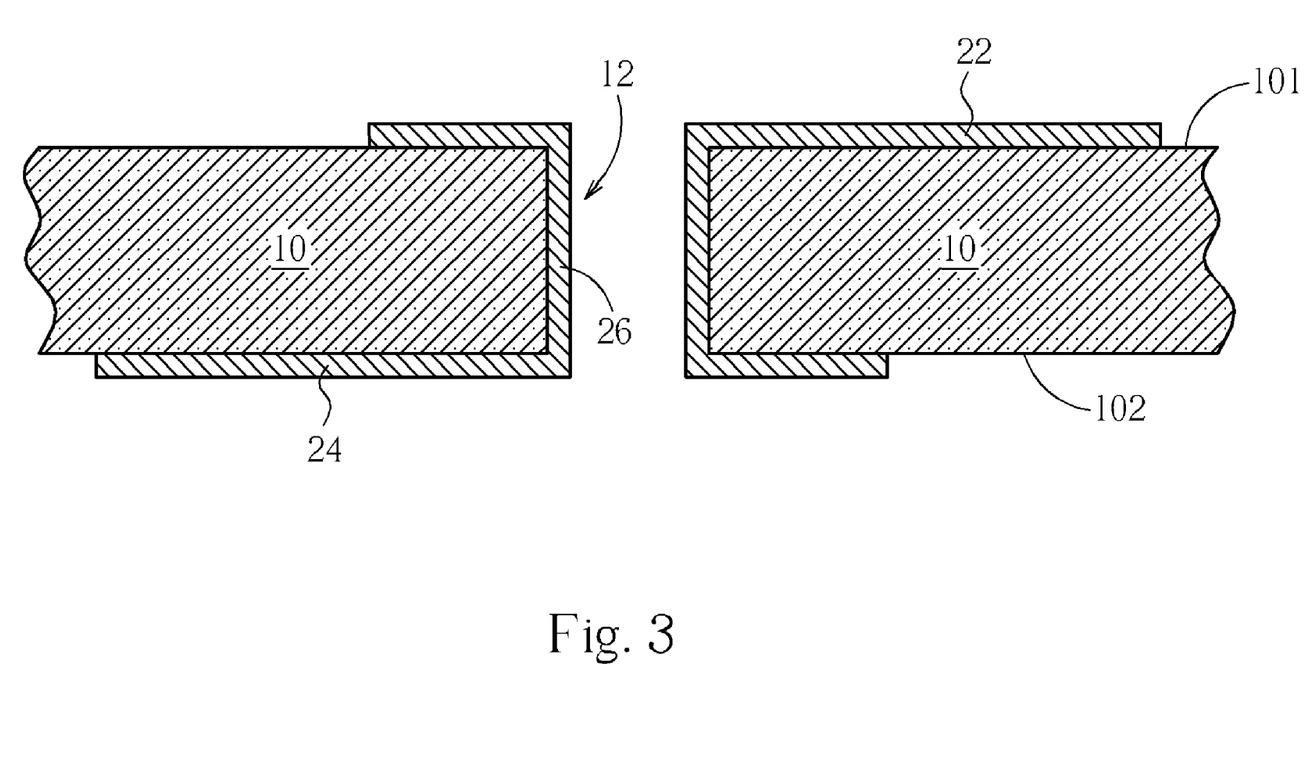

As shown in FIG. 3, a lithography and etching process is performed to form a copper pad pattern 22 on the top surface 101 of the substrate 10 and a copper pad pattern 24 on the bottom surface 102 of the substrate 10, wherein the copper pad pattern 22 and the copper pad pattern 24 are electrically connected to each other through the via copper 26 on the sidewall of the through hole 12.

Figure 4:
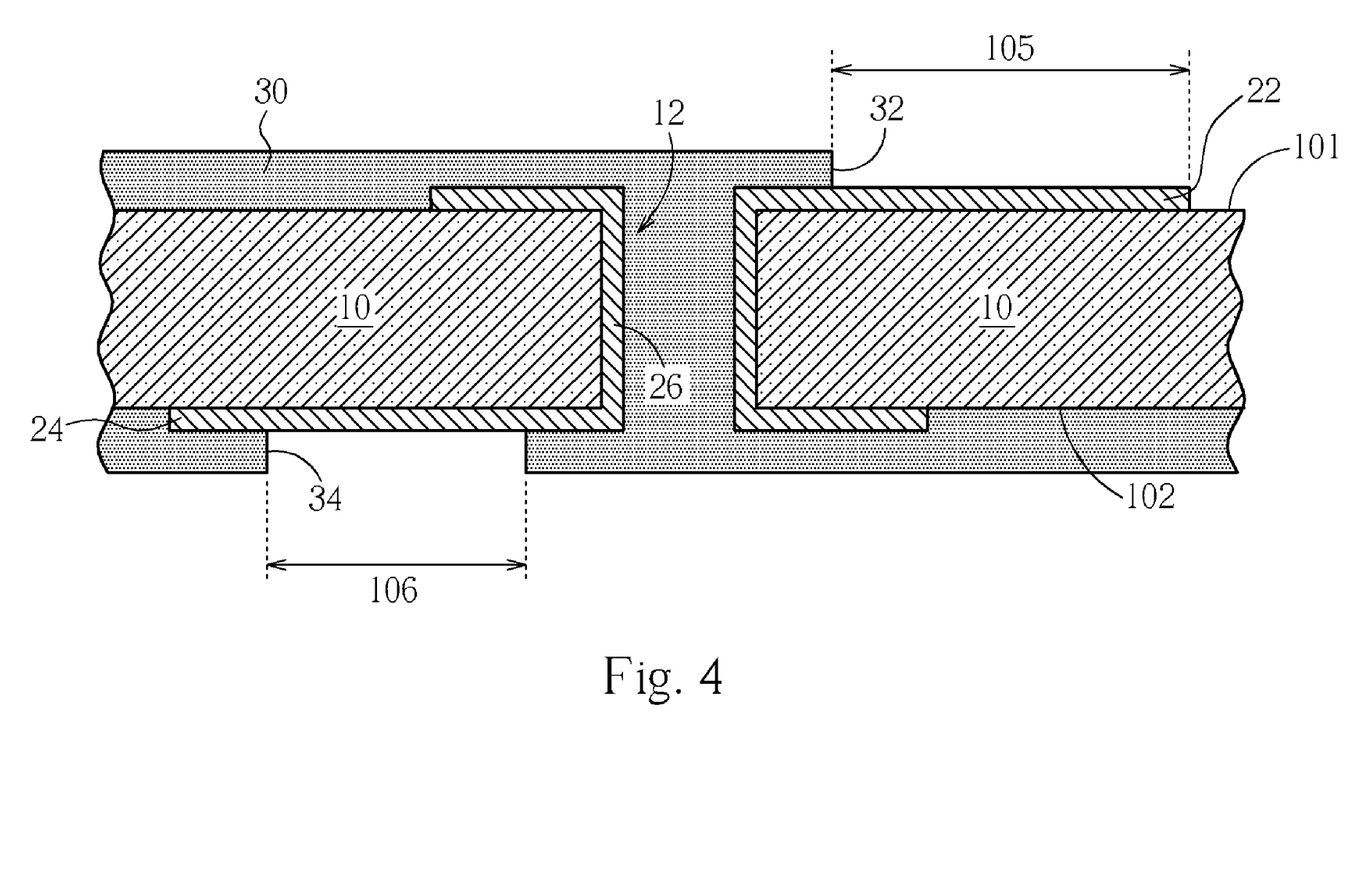

Subsequently, as shown in FIG. 4, a layer of solder mask 30 is coated onto the top surface 101 and the bottom surface 102 of the substrate 10. The solder mask 30 fills the through holes 12. The solder mask 30 is made of photo resist, which can absorb light with certain frequencies. By performing a conventional lithographic process, an opening 32 and an opening 34 are formed respectively on the top surface 101 and the bottom surface 102 of the substrate 10 in the solder mask 30. The openings 32 and 34 expose the gold-plating areas 105 and 106, respectively.

Figure 5:
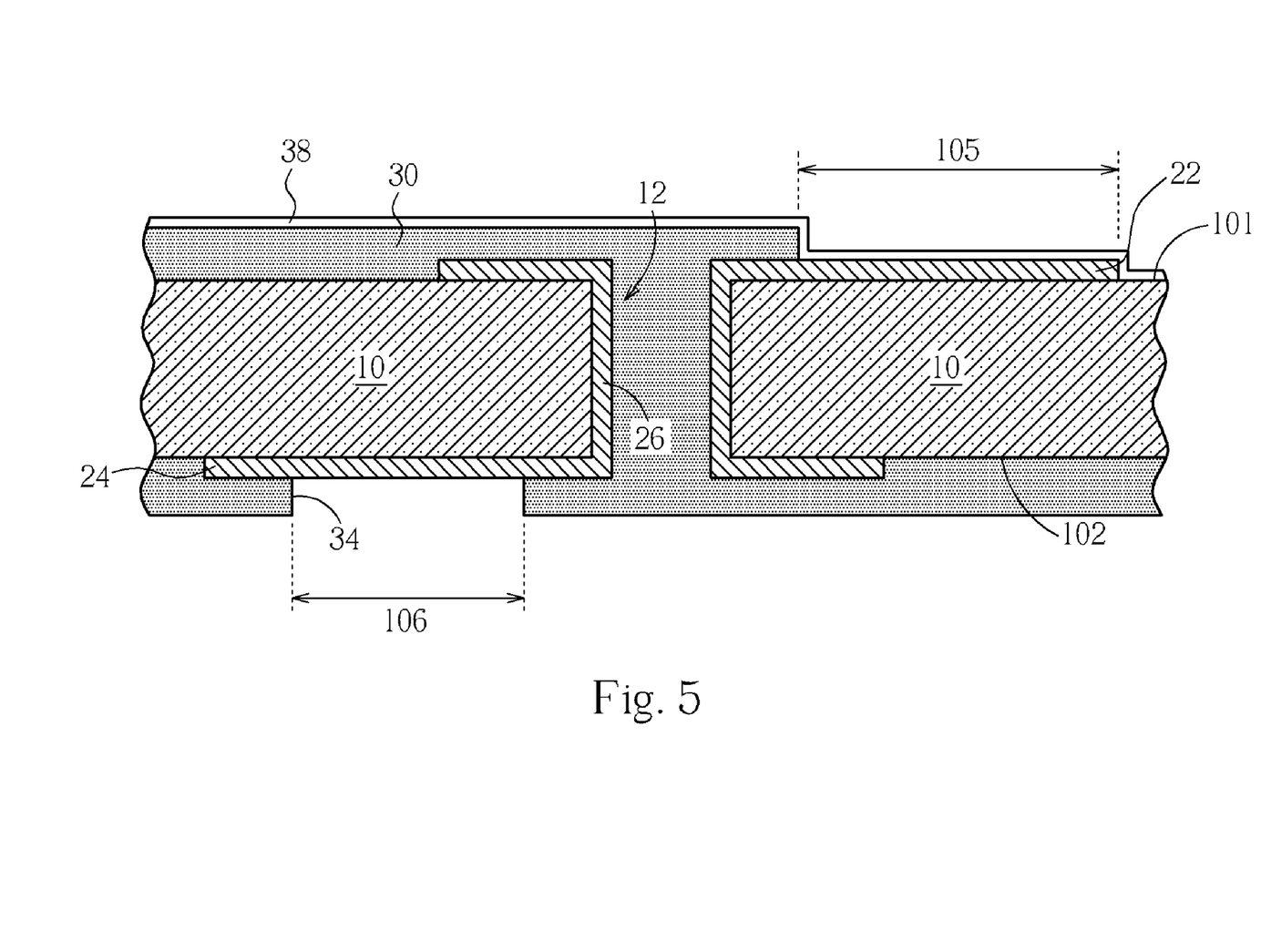

As shown in FIG. 5, the top surface 101 of the substrate 10 is blanketed with a conductive layer 38. The conductive layer 38 covers the solder mask 30 and the exposed copper pad pattern 22 and substrate 10. Preferably, the conductive layer 38 is a metal layer such as a copper layer, but any other suitable conductive materials may be applied.

Figure 6:
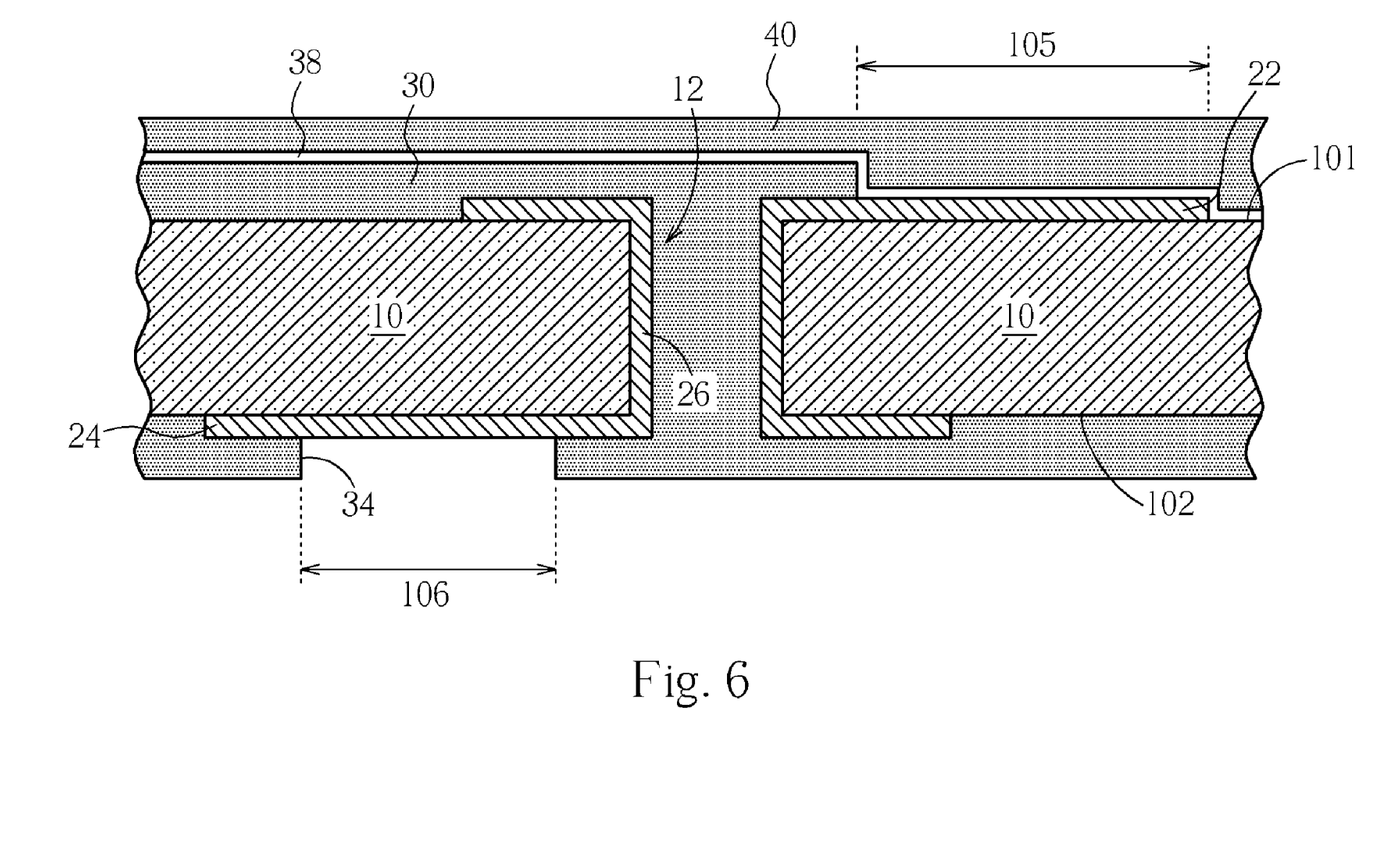

As shown in FIG. 6, an insulating layer 40 is then deposited on the conductive layer 38. According to this embodiment, the insulating layer 40 is made of solder mask material.

Figure 7:
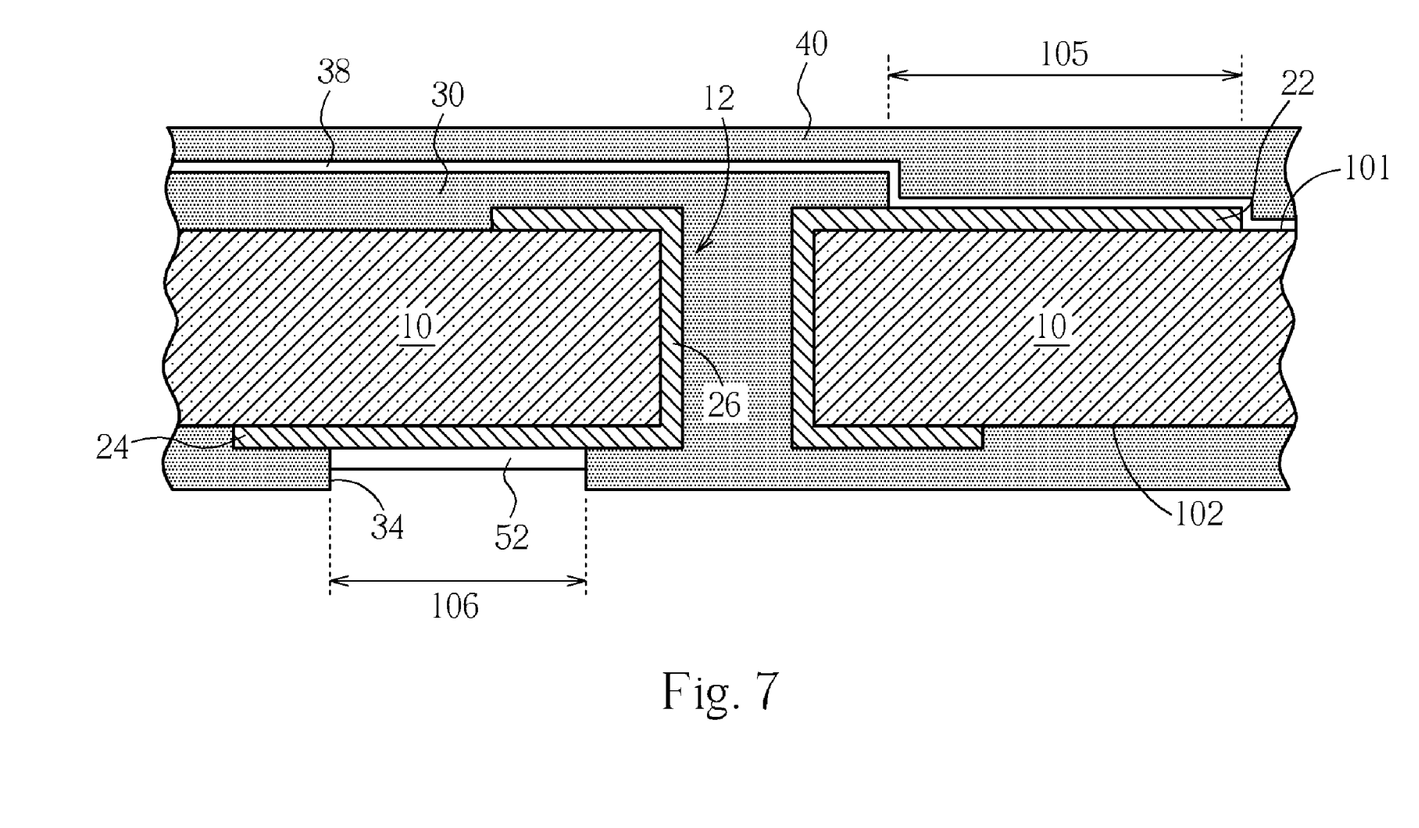

As shown in FIG. 7, an electroplating process is carried out to electroplate a metal layer 52 such as Ni/Au onto the exposed copper pad pattern 24 on the bottom surface 102. It is a pivotal feature of the present invention that during the aforesaid electroplating process, a voltage potential is provided to the copper pad pattern 24 through the conductive layer 38 and the copper pad pattern 22 on the top surface 101 of the substrate 10 and through the via copper 26 on the sidewall of the through hole 12.

It is advantageous to use the present invention because the gold-plating area 106 is defined by the solder mask 30 prior to the Ni/Au electroplating. By doing this, the metal layer 52 does not overlap with the solder mask 30, thereby preventing peeling problems. At this phase, the top surface 101 of the substrate 10 is not electroplated with Ni/Au since it is covered with the insulating layer 40.

Figure 8:
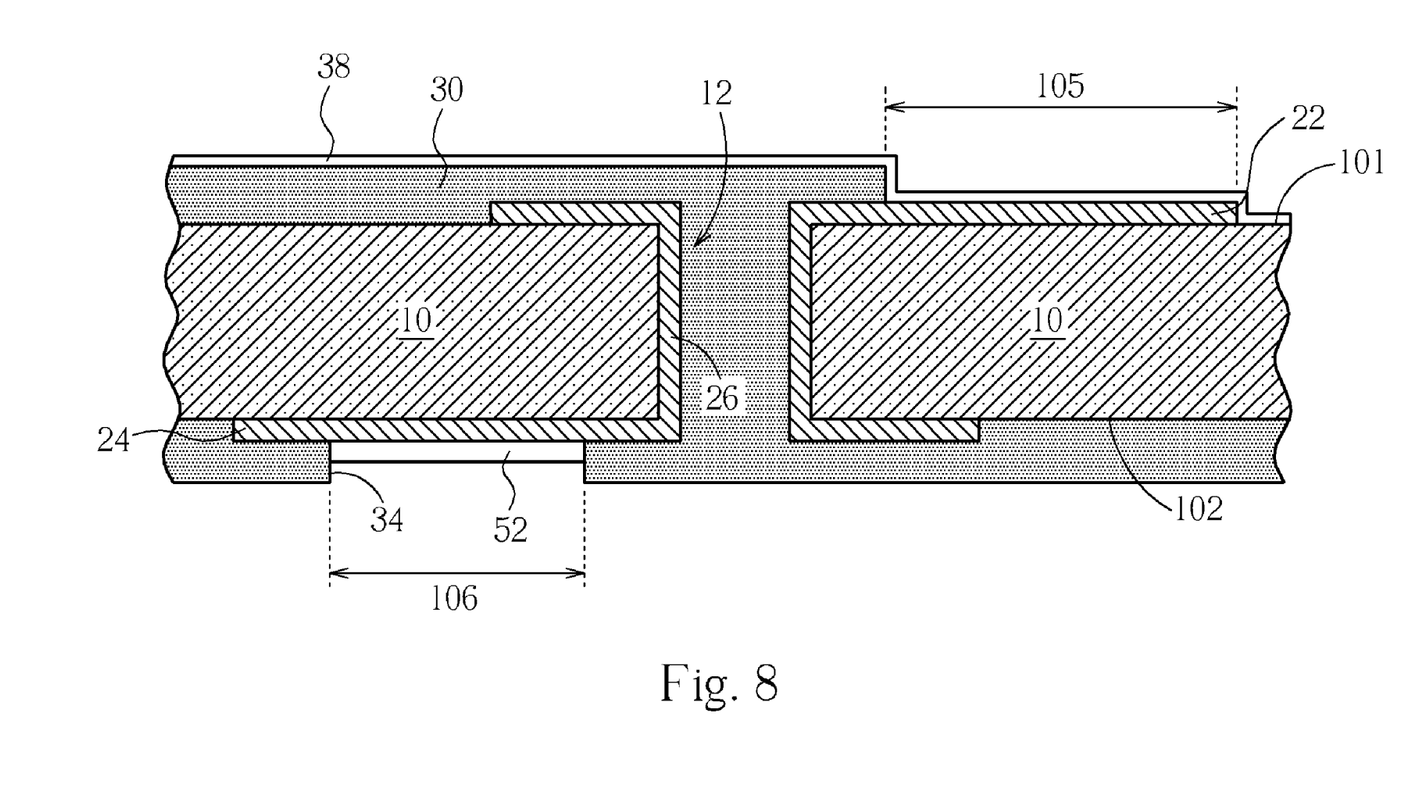

After finishing the electroplating of the metal layer 52 within the gold-plating area 106, as shown in FIG. 8, the insulating layer 40 on the top surface 101 of the substrate 10 is then stripped off.

Figure 9:
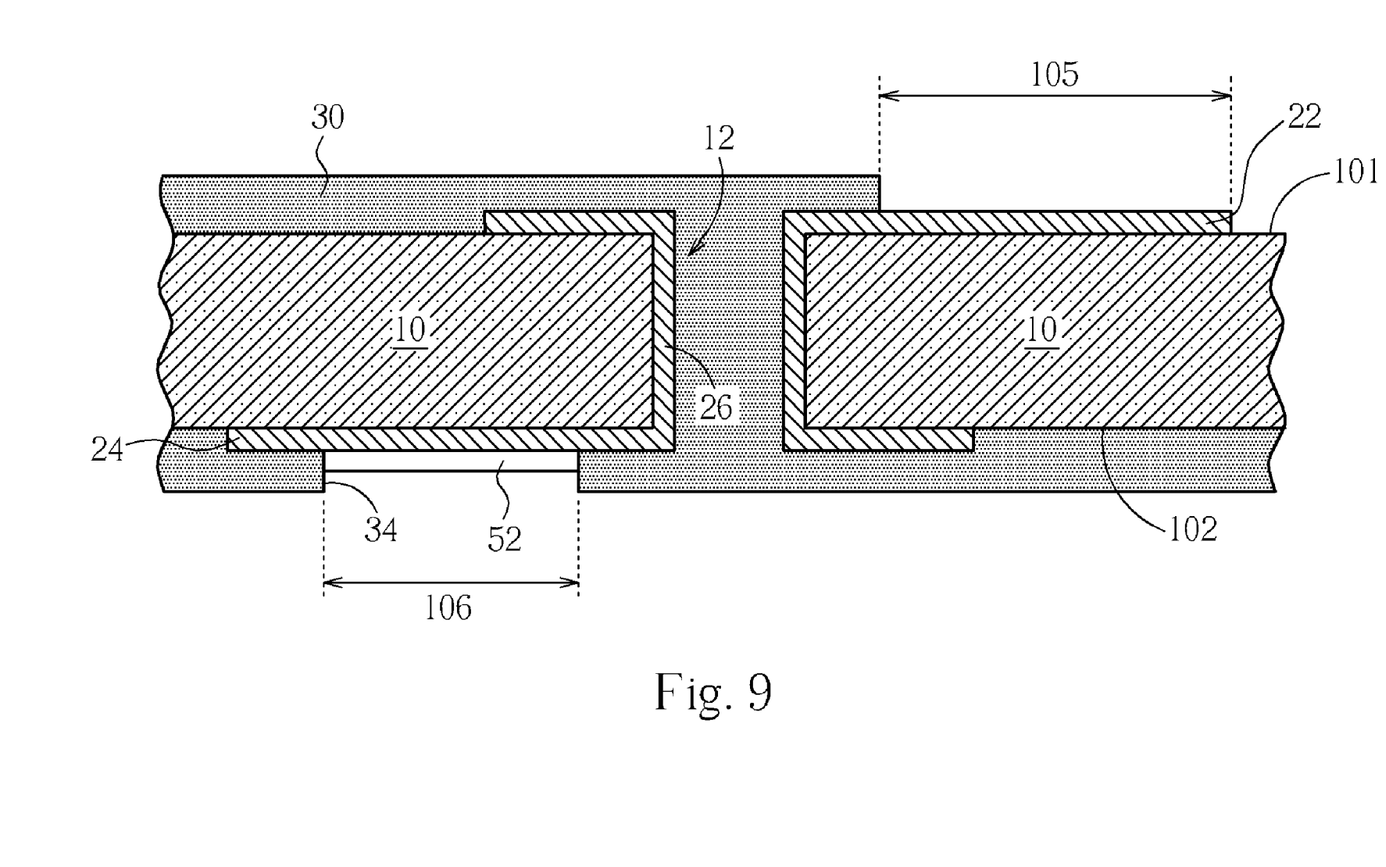

As shown in FIG. 9, the conductive layer 38 is then removed to expose the copper pad pattern 22 within the gold-plating area 105.

Figure 10:
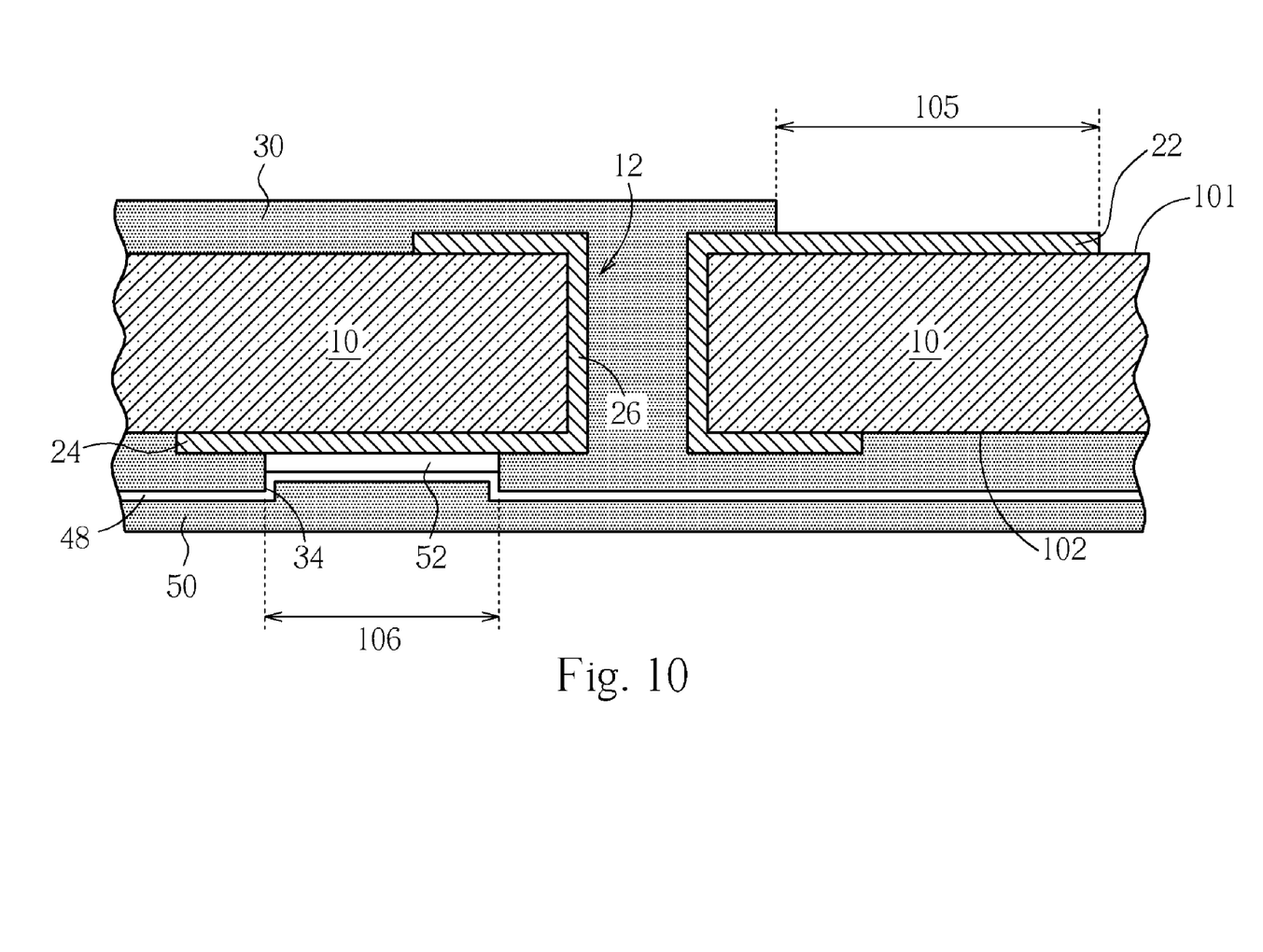
Figure 11:
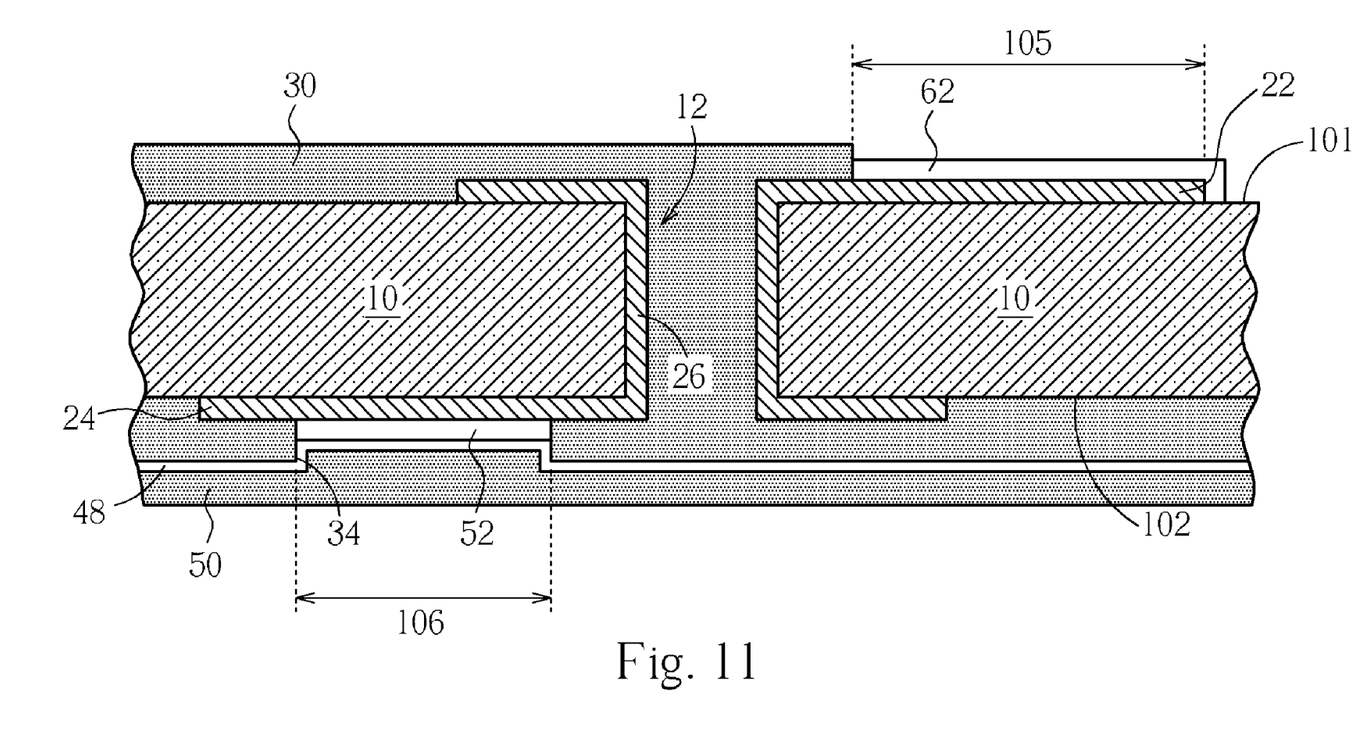
Figure 12:
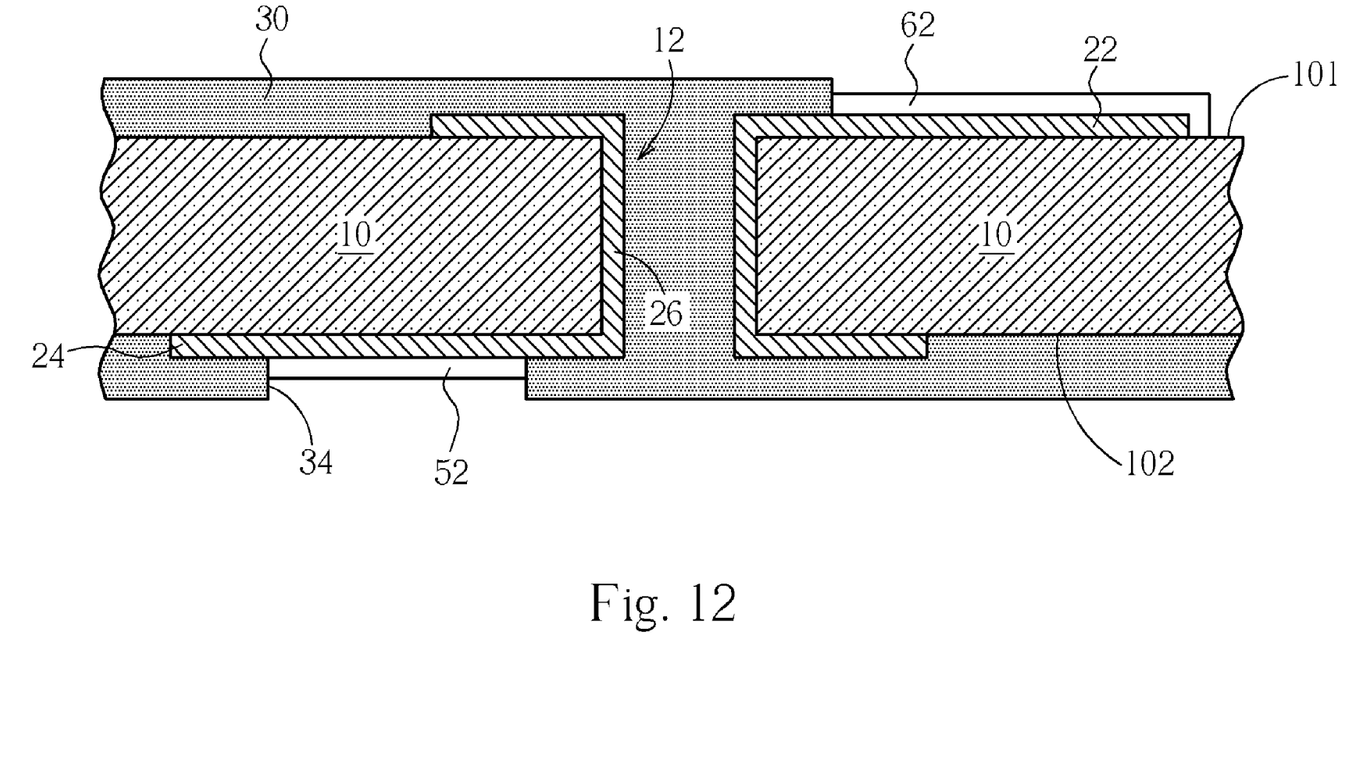

With reference to FIG. 10 to FIG. 12, the process steps of electroplating Ni/Au within the gold-plating area 105 on the top surface 101 of the substrate 10 are explained. Generally, the process steps of electroplating Ni/Au within the gold-plating area 105 on the top surface 101 are similar to the process steps of electroplating Ni/Au within the gold-plating area 106 on the top surface 102.

As shown in FIG. 10, the bottom surface 102 of the substrate 10 is blanketed with a conductive layer 48. The conductive layer 48 covers the solder mask 30 on the bottom surface 102 and the metal layer 52 within the gold-plating area 106. Preferably, the conductive layer 48 is a metal layer such as a copper layer or any other suitable conductive materials. An insulating layer 50 is then deposited on the conductive layer 48. According to this embodiment, the insulating layer 50 is made of solder mask material.

As shown in FIG. 11, another electroplating process is carried out to electroplate a metal layer 62 such as Ni/Au onto the exposed copper pad pattern 22 on the top surface 101. During the electroplating process, a voltage potential is provided to the copper pad pattern 22 through the conductive layer 48, the metal layer 52 and the copper pad pattern 24 on the bottom surface 102 of the substrate 10, and through the via copper 26 on the sidewall of the through hole 12. The bottom surface 102 of the substrate 10 will not be electroplated again since it is covered with the insulating layer 50.

Finally, as shown in FIG. 12, the insulating layer 50 on the bottom surface 102 of the substrate 10 is stripped off. The conductive layer 48 is then removed to expose the metal layer 52.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a packaging substrate, comprising:

providing a substrate having at least one through hole formed thereon;

coating a first conductive layer on a top surface and a bottom surface of said substrate, and on sidewall of said through hole;

performing a lithographic and etching process to pattern said first conductive layer into a first wire pattern on said top surface of said substrate and a second wire pattern on said bottom surface of said substrate, wherein said first wire pattern and said second wire pattern are electrically connected to each other via said through hole;

coating a solder mask on said top surface and said bottom surface of said substrate, and said solder mask filling said through hole;

forming, in said solder mask, a first opening exposing a portion of said first wire pattern and a second opening exposing a portion of said second wire pattern;

blanketing said top surface of said substrate with a second conductive layer, wherein said second conductive layer covers said solder mask and said first opening, and is electrically connected with said first wire pattern;

coating a first insulating layer on said second conductive layer; and electroplating a third conductive layer on said second wire pattern within said second opening on said bottom surface of said substrate.

2. The method for manufacturing a packaging substrate according to claim 1 wherein after electroplating a third conductive layer on said second wire pattern within said second opening on said bottom surface of said substrate, the method further comprises the following steps:

stripping said first insulating layer; and etching away said second conductive layer to expose said first wire pattern within said first opening.

3. The method for manufacturing a packaging substrate according to claim 2 wherein after etching away said second conductive layer, the method further comprises the following steps:

blanketing said bottom surface of said substrate with a fourth conductive layer, wherein said fourth conductive layer covers said solder mask and said second opening, and is electrically connected with said second wire pattern;

coating a second insulating layer on said fourth conductive layer; and electroplating a fifth conductive layer on said first wire pattern within said first opening on said top surface of said substrate.

4. The method for manufacturing a packaging substrate according to claim 3 wherein said fourth conductive layer is made of copper.

5. The method for manufacturing a packaging substrate according to claim 3 wherein said fifth conductive layer comprises gold and nickel.

6. The method for manufacturing a packaging substrate according to claim 1 wherein said first conductive layer comprises copper.

7. The method for manufacturing a packaging substrate according to claim 1 wherein said third conductive layer comprises gold and nickel.

8. The method for manufacturing a packaging substrate according to claim 1 wherein said second conductive layer comprises copper.

* * * * *